US006781382B2

(12) United States Patent
Johnson (10) Patent No.: US 6,781,382 B2
(45) Date of Patent: Aug. 24, 2004

(54) ELECTRONIC BATTERY TESTER (75) Inventor: Frederick M. Johnson, Lockport, IL (US)

(73) Assignee: Midtronics, Inc., Willowbrook, IL (US)

(*) Notice: Subject to any disclaimer, the term of this patent is extended or adjusted under 35 U.S.C. 154(b) by 0 days.

(21) Appl. No.: 10/310,490

(22) Filed: Dec. 5, 2002

(65) Prior Publication Data

US 2004/0108856 A1 Jun. 10, 2004

(51) Int. Cl.[7] .................................................. H02J 7/00
(52) U.S. Cl. ..................................... 324/426; 320/132
(58) Field of Search .............................. 324/426, 433, 324/429; 320/132, 134, 155, 116, 119; 702/63

(56) References Cited

U.S. PATENT DOCUMENTS

| 2,514,745 A | 7/1950 | Dalzell | 171/95 |
| 3,356,936 A | 12/1967 | Smith | 324/29.5 |

(List continued on next page.)

FOREIGN PATENT DOCUMENTS

| DE | 29 26 716 B1 | 1/1981 |
| EP | 0 022 450 A1 | 1/1961 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| RU | 2089015 C1 | 8/1997 |
| WO | WO 93/22666 | 11/1993 |
| WO | WO 94/05069 | 3/1994 |
| WO | WO 98/58270 | 12/1998 |
| WO | WO 99/23738 | 5/1999 |
| WO | WO 00/67359 | 11/2000 |
| WO | WO 01/51947 | 7/2001 |

OTHER PUBLICATIONS

"Electrochemical Impedance Spectroscopy in Battery Development and Testing", *Batteries International*, Apr. 1997, pp. 59 and 62–63.

(List continued on next page.)

*Primary Examiner*—Lawrence Luk
(74) *Attorney, Agent, or Firm*—Westman, Champlin & Kelly (57) ABSTRACT

An electronic battery tester for testing a storage battery is provided. The tester includes a pair of Kelvin connectors that can electrically couple to terminals of the battery. Also included, is a source that can apply a time varying forcing function to the battery through the Kelvin connectors. A sensor that electrically couples to the Kelvin connectors can sense a response of the storage battery to the applied forcing function and provide a response signal. An analog to digital converter digitizes the response signal. Processing circuitry converts the digitized response signal into multiple Fourier components and determines noise in the response signal from a subset of the multiple Fourier components.

20 Claims, 4 Drawing Sheets

U.S. PATENT DOCUMENTS

| | | | |
|---|---|---|---|
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,676,770 A | 7/1972 | Sharaf et al. | 324/29.5 |
| 3,729,989 A | 5/1973 | Little | 73/133 |
| 3,753,094 A | 8/1973 | Furuishi et al. | 324/29.5 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 4,008,619 A | 2/1977 | Alcaide et al. | 73/398 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/29.5 |
| 4,070,624 A | 1/1978 | Taylor | 327/158 |
| 4,086,531 A | 4/1978 | Bernier | 324/158 |
| 4,112,351 A | 9/1978 | Back et al. | 324/16 |
| 4,114,083 A | 9/1978 | Benham et al. | 320/39 |
| 4,126,874 A | 11/1978 | Suzuki et al. | 354/60 |
| 4,178,546 A | 12/1979 | Hulls et al. | 324/158 |
| 4,193,025 A | 3/1980 | Frailing et al. | 324/427 |
| 4,207,611 A | 6/1980 | Gordon | 364/580 |
| 4,217,645 A | 8/1980 | Barry et al. | 364/483 |
| 4,297,639 A | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/26 |
| 4,379,990 A | 4/1983 | Sievers et al. | 322/99 |
| 4,385,269 A | 5/1983 | Aspinwall et al. | 320/14 |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,564,798 A | 1/1986 | Young | 320/6 |
| 4,633,418 A | 12/1986 | Bishop | 364/554 |
| 4,659,977 A | 4/1987 | Kissel et al. | 320/64 |
| 4,663,580 A | 5/1987 | Wortman | 320/35 |
| 4,665,370 A | 5/1987 | Holland | 324/429 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,686,442 A | 8/1987 | Radomski | 320/17 |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/22 |
| 4,816,768 A | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. et al. | 320/35 |
| 4,849,700 A | 7/1989 | Morioka et al. | 324/427 |
| 4,876,495 A | 10/1989 | Palanisamy et al. | 320/18 |
| 4,881,038 A | 11/1989 | Champlin | 324/426 |
| 4,888,716 A | 12/1989 | Ueno | 364/550 |
| 4,912,416 A | 3/1990 | Champlin | 324/430 |
| 4,913,116 A | 4/1990 | Katogi et al. | 123/425 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,956,597 A | 9/1990 | Heavey et al. | 320/14 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Kuznicki | 340/636 |
| 5,037,778 A | 8/1991 | Stark et al. | 437/216 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,194,799 A | 3/1993 | Tomantschger | 320/2 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,315,287 A | 5/1994 | Sol | 340/455 |
| 5,321,626 A | 6/1994 | Palladino | 364/483 |
| 5,323,337 A | * 6/1994 | Wilson et al. | 702/73 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/20 |
| 5,434,495 A | 7/1995 | Toko | 320/44 |
| 5,435,185 A | 7/1995 | Eagan | 73/587 |
| 5,442,274 A | 8/1995 | Tamai | 320/23 |
| 5,445,026 A | 8/1995 | Eagan | 73/591 |
| 5,449,996 A | 9/1995 | Matsumoto et al. | 320/20 |
| 5,449,997 A | 9/1995 | Gilmore et al. | 320/39 |

| | | | |
|---|---|---|---|
| 5,451,881 A | 9/1995 | Finger | 324/433 |
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/48 |
| 5,572,136 A | 11/1996 | Champlin | 324/426 |
| 5,574,355 A | 11/1996 | McShane et al. | 320/39 |
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 5,633,985 A | 5/1997 | Severson et al. | 395/2.76 |
| 5,637,978 A | 6/1997 | Kellett et al. | 320/2 |
| 5,642,031 A | 6/1997 | Brotto | 320/21 |
| 5,650,937 A | 7/1997 | Bounaga | 364/483 |
| 5,652,501 A | 7/1997 | McClure et al. | 320/17 |
| 5,653,659 A | 8/1997 | Kunibe et al. | 477/111 |
| 5,656,920 A | 8/1997 | Cherng et al. | 320/31 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/6 |
| 5,711,648 A | 1/1998 | Hammerslag | 414/786 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,747,909 A | 5/1998 | Syverson et al. | 310/156 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,773,978 A | 6/1998 | Becker | 324/430 |
| 5,789,899 A | 8/1998 | van Phuoc et al. | 320/30 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/43.4 |
| 5,818,234 A | 10/1998 | McKinnon | 324/433 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |
| 5,872,443 A | 2/1999 | Williamson | 320/21 |
| 5,895,440 A | 4/1999 | Proctor et al. | 702/63 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/426 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636 |
| 6,002,238 A | 12/1999 | Champlin | 320/134 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A | 4/2000 | Bertness | 324/426 |
| 6,061,638 A | 5/2000 | Joyce | 702/63 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,091,245 A | 7/2000 | Bertness | 324/426 |
| 6,094,003 A | 7/2000 | Kim et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,161,640 A | 12/2000 | Yamaguchi | 180/65.8 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,222,369 B1 | 4/2001 | Champlin | 324/430 |
| 6,225,808 B1 | 5/2001 | Varghese et al. | 324/426 |
| 6,236,332 B1 | 5/2001 | Conkright et al. | 340/825.06 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,254 B1 | 7/2001 | Klang | 324/427 |
| 6,262,563 B1 | 7/2001 | Champlin | 320/134 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| 6,384,608 B1 | 5/2002 | Namaky | 324/425 |
| 6,388,448 B1 | 5/2002 | Cervas | 324/426 |
| 6,392,414 B2 | 5/2002 | Bertness | 324/429 |
| 6,411,098 B1 | 6/2002 | Laletin | 324/436 |
| 6,417,669 B1 | 7/2002 | Champlin | 324/426 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |
| 6,495,990 B2 | 12/2002 | Champlin | 320/132 |
| 6,556,019 B2 * | 4/2003 | Bertness | 324/426 |

OTHER PUBLICATIONS

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Freprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", 3/69, Linear Brief 5, Mar. 1969.

Burr–Brown Corporation, "Design A 60 Hz Notch Filter with the UAF42", 1/94, AB–071, 1994.

National Semiconductor Corporation, "LMF90–$4^{th}$–Order Elliptic Notch Filter", 12/94, RRD–B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e–Catalog*, downloaded from http://www.pcbcafe.com, undated.

"Simple DC–DC Converts Allows Use of Single Battery", *Electronix Express*, downloaded from http://www.elexp.com/t_dc–dc.htm, undated.

"DC–DC Converter Basics", *Power Designers*, downloaded from http://www.powederdesigners.com/InforWeb.design_center/article/DC–DC/converter.shtm, undated.

"Notification of Transmittal of The International Search Report or the Declaration", PCT/US02/29461.

"Notification of Transmittal of International Search Report or the Declaration" for PCT/US02/29461.

* cited by examiner

ELECTRONIC BATTERY TESTER

BACKGROUND OF THE INVENTION

The present invention relates to testing of storage batteries. More specifically, the present invention relates to detecting noise in an electronic battery tester while it conducts a battery test.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin and Midtronics, Inc. for testing storage batteries by measuring the conductance of the batteries. This technique is described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Ser. No. 09/595,102, filed Jun. 15, 2000, entitled APPARATUS AND METHOD FOR TESTING RECHARGEABLE ENERGY STORAGE BATTERIES; U.S. Ser. No. 09/703,270, filed Oct. 31, 2000, entitled ELECTRONIC BATTERY TESTER; U.S. Ser. No. 09/575,629, filed May 22, 2000, entitled VEHICLE ELECTRICAL SYSTEM TESTER WITH ENCODED OUTPUT; U.S. Ser. No. 09/780,146, filed Feb. 9, 2001, entitled STORAGE BATTERY WITH INTEGRAL BATTERY TESTER; U.S. Ser. No. 09/816,768, filed Mar. 23, 2001, entitled MODULAR BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/483,623, filed Jan. 13, 2000, entitled ALTERNATOR TESTER; U.S. Ser. No. 09/870,410, filed May 30, 2001, entitled INTEGRATED CONDUCTANCE AND LOAD TEST BASED ELECTRONIC BATTERY TESTER; U.S. Ser. No. 09/960,117, filed Sep. 20, 2001, entitled IN-VEHICLE BATTERY MONITOR; U.S. Ser. No. 09/908,389, filed Jul. 18, 2001, entitled BATTERY CLAMP WITH INTEGRATED CIRCUIT SENSOR; U.S. Ser. No. 09/908,278, filed Jul. 18, 2001, entitled BATTERY CLAMP WITH EMBEDDED ENVIRONMENT SENSOR, U.S. Ser. No. 09/880,473, filed Jun. 13, 2001; entitled BATTERY TEST MODULE; U.S. Ser. No. 09/876,564, filed Jun. 7, 2001, entitled ELECTRONIC BATTERY TESTER; U.S. Ser. No. 09/878,625, filed Jun. 11, 2001, entitled SUPPRESSING INTERFERENCE IN AC MEASUREMENTS OF CELLS, BATTERIES AND OTHER ELECTRICAL ELEMENTS; U.S. Ser. No. 09/902,492, filed Jul. 10, 2001, entitled APPARATUS AND METHOD FOR CARRYING OUT DIAGNOSTIC TESTS ON BATTERIES AND FOR RAPIDLY CHARGING BATTERIES; and U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 09/977,049, filed Oct. 12, 2001, entitled PROGRAMMABLE CURRENT EXCITER FOR MEASURING AC IMMITTANCE OF CELLS AND BATTERIES; U.S. Ser. No. 10/047,923, filed Oct. 23, 2001, entitled AUTOMOTIVE BATTERY CHARGING SYSTEM TESTER, U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 10/042,451, filed Jan. 8, 2002, entitled BATTERY CHARGE CONTROL DEVICE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/101,543, filed Mar. 19, 2002, entitled ELECTRONIC BATTERY TESTER; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 10/128,790, filed Apr. 22, 2002, entitled METHOD OF DISTRIBUTING JUMP-START BOOSTER PACKS; U.S. Ser. No. 10/143,307, filed May 10, 2002, entitled ELECTRONIC BATTERY TESTER; U.S. Ser. No. 10/207,495, filed Jul. 29, 2002, entitled KELVIN CLAMP FOR ELECTRICALLY COUPLING TO A BATTERY CONTACT, which are incorporated herein in their entirety.

However, there is an ongoing need to improve battery testing techniques to increase the accuracy of battery test results. One prior art battery testing technique involves the use of a differential amplifier to measure battery voltage during the application of a time varying current signal to the battery. The presence of noise at the output of the amplifier while the amplifier measures battery voltage during the application of the current signal can introduce errors into test results.

SUMMARY OF THE INVENTION

An electronic battery tester for testing a storage battery is provided. The tester includes a first Kelvin connector that can electrically couple to a first terminal of the battery and a second Kelvin connector that can electrically couple to a second terminal of the battery. Also included, is a source that can apply a time varying forcing function to the battery through a first conductor of the first Kelvin connector and a first conductor of the second Kelvin connector. A sensor that electrically couples to a second conductor of the first Kelvin connector and a second conductor of the second Kelvin connector can sense a response of the storage battery to the applied forcing function and provide a response signal. An analog to digital converter digitizes the response signal. Processing circuitry converts the digitized response signal into multiple Fourier components and determines noise in the response signal from a subset of the multiple Fourier components.

DETAILED DESCRIPTION OF THE PREFERRED EMBODIMENTS

Figure 1:
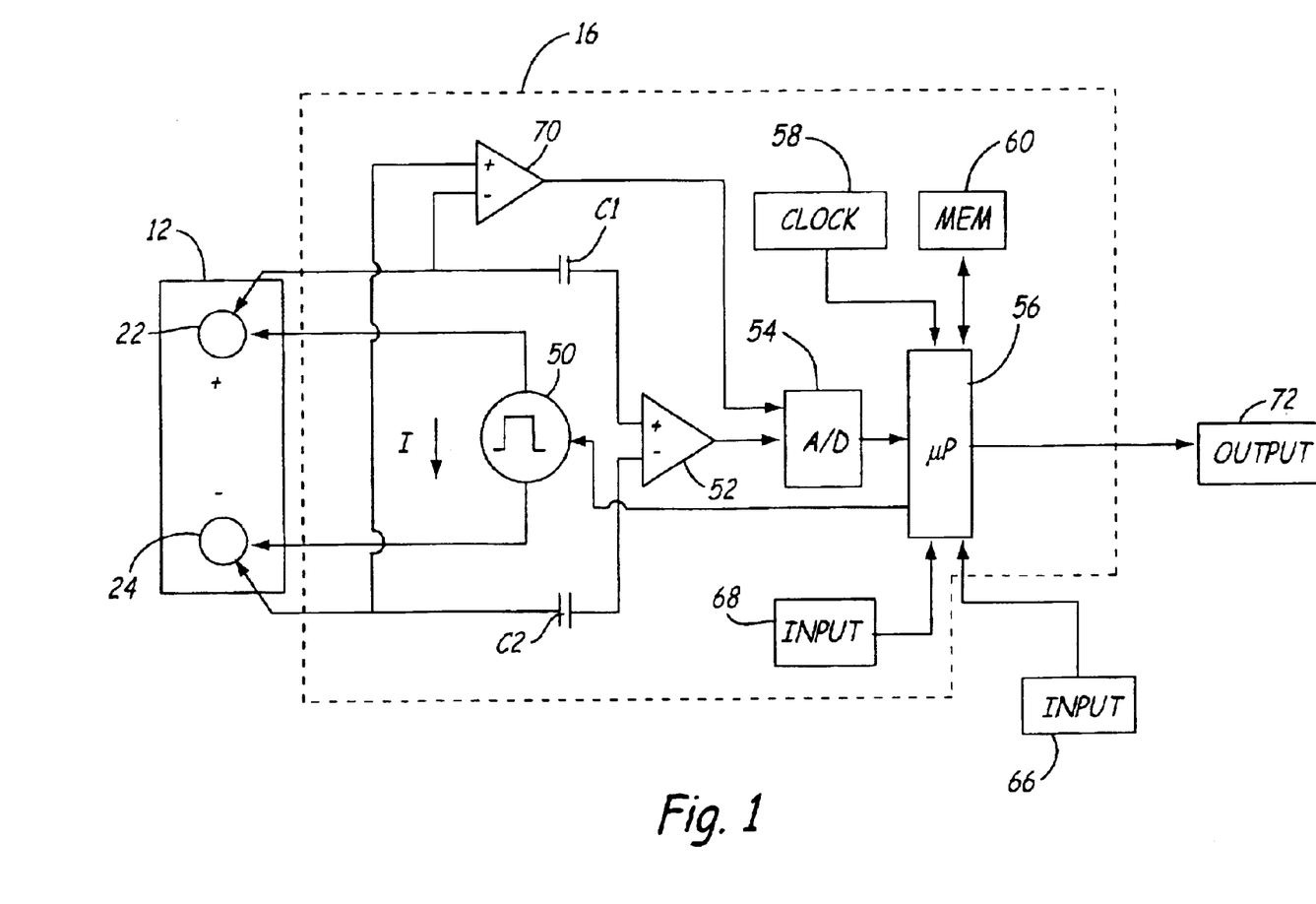
FIG. 1 is a simplified block diagram of a battery tester in accordance with the present invention.

FIG. 1 is a simplified block diagram of battery monitoring circuitry 16 in accordance with the present invention. Apparatus 16 is shown coupled to battery 12 which includes a positive battery terminal 22 and a negative battery terminal 24.

In a preferred embodiment, circuitry 16 operates, with the exceptions and additions as discussed below, in accordance with battery testing methods described in one or more of the United States patents obtained by Dr. Champlin and Midtronics, Inc. and listed above. Circuitry 16 operates in accordance with one embodiment of the present invention and determines the conductance ($G_{BAT}$) of battery 12 and the voltage potential ($V_{BAT}$) between terminals 22 and 24 of battery 12. Circuitry 16 includes current source 50, differential amplifier 52, analog-to-digital converter 54 and processing circuitry 56. Current source 50 provides one example of a forcing function for use with the invention. Amplifier 52 is capacitively coupled to battery 12 through capacitors $C_1$ and $C_2$. Amplifier 52 has an output connected to an input of analog-to-digital converter 54. Processing circuitry 56 can be a microprocessor, digital signal processor, etc. Processing circuitry 56 is connected to system clock 58, memory 60, and analog-to-digital converter 54. Processing circuitry 56 is also capable of receiving an input from input devices 66 and 68. Processing circuitry 56 also connects to output device 72.

In operation, current source 50 is controlled by processing circuitry 56 and provides a current I in the direction shown by the arrow in FIG. 1. In one embodiment, this is a sine wave, square wave or a pulse. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 16 includes differential amplifier 70 having inverting and noninverting inputs connected to terminals 24 and 22, respectively. Amplifier 70 is connected to measure the open circuit potential voltage ($V_{BAT}$) of battery 12 between terminals 22 and 24 and is one example of a dynamic response sensor used to sense the time varying response of the battery 18 to the applied time varying forcing function. The output of amplifier 70 is provided to analog-to-digital converter 54 such that the voltage across terminals 22 and 24 can be measured by processing circuitry 56.

Circuitry 16 is connected to battery 12 through a four-point connection technique known as a Kelvin connection. This Kelvin connection allows current I to be injected into battery 12 through a first pair of connections while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to processing circuitry 56. Processing circuitry 56 operates at a frequency determined by system clock 58 and in accordance with programming instructions stored in memory 60.

Processing circuitry 56 determines the conductance of battery 12 by applying a current pulse I using current source 50. This measurement provides a dynamic parameter related to the battery. Of course, any such dynamic parameter can be measured including resistance, admittance, impedance or their combination along with conductance. Further, any type of time varying signal can be used to obtain the dynamic parameter. The signal can be generated using an active forcing function or using a forcing function which provides a switchable load, for example, coupled to the battery 12. The processing circuitry determines the change in battery voltage due to the current pulse I using amplifier 52 and analog-to-digital converter 54. The value of current I generated by current source 50 is known and is stored in memory 60. In one embodiment, current I is obtained by applying a load to battery 12. Processing circuitry 56 calculates the conductance of battery 12 using the following equation:

$$G_{BAT} = \frac{\Delta I}{\Delta V} \quad \text{Equation 1}$$

where $\Delta I$ is the change in current flowing through battery 12 due to current source 50 and $\Delta V$ is the change in battery voltage due to applied current $\Delta I$. Based upon the battery conductance $G_{BAT}$ and the battery voltage, the battery tester 16 determines the condition of battery 12. Battery tester 16 is programmed with information which can be used with the determined battery conductance and voltage as taught in the above listed patents to Dr. Champlin and Midtronics, Inc.

The tester can compare the measured CCA (Cold Cranking Amp) with the rated CCA for that particular battery. Processing circuitry 56 can also use information input from input device 66 provided by, for example, an operator. This information may consist of the particular type of battery, location, time, the name of the operator. Additional information relating to the conditions of the battery test can be received by processing circuitry 56 from input device 68. Input device 68 may comprise one or more sensors, for example, or other elements which provide information such as ambient or battery temperature, time, date, humidity, barometric pressure, noise amplitude or characteristics of noise in the battery or in the test result, or any other information or data which may be sensed or otherwise recovered which relates to the conditions of the test how the battery test was performed, or intermediate results obtained in conducting the test. Additional test condition information is provided by processing circuitry 56. Such additional test condition information may include the values of $G_{BAT}$ and battery voltage, the various inputs provided to battery tester 16 by the operator which may include, for example, type of battery, estimated ambient or battery temperature, type of vehicle (i.e., such as provided through the Vehicle Identification Number (VIN) code for the vehicle) or the particular sequence of steps taken by the operator in conducting the test.

Typically, prior art battery testers do not take into consideration the presence of noise at the output of amplifier 52 while amplifier 52 measures battery voltage during the application of the current pulse I. However, one aspect of the present invention includes the recognition that the conductance, impedance, resistance or admittance computed as a function of the battery voltage measured using the prior art measurement technique may include a degree of error due to the presence of noise while obtaining the voltage measurement. Noise components that may be present at the output of amplifier 52, while battery voltage measurements are being carried out by amplifier 52, can also be taken into consideration to more accurately determine the condition of battery 12. Thus, processing circuitry 56 utilizes different components corresponding to different frequencies of voltage measured by amplifier 52 to determine condition information of battery 12.

In accordance with the present invention, the digitized response signal, corresponding to the battery voltage measured by amplifier 52, obtained at the output of analog-to-digital converter 54, is converted into a plurality of Fourier components by processing circuitry 56. Processing circuitry 56 also determines noise in the response signal from a subset (less than all) of the plurality of Fourier components. The condition of battery 12 is then output by processing circuitry 56 if the noise in the response signal is below a predetermined threshold. As used herein, Fourier components are values obtained as a result of applying a Fourier Transform to a current or voltage signal. The Fourier components provide a frequency domain representation of the current or voltage signal.

In a narrower aspect of the present invention, a first battery capacity measurement (peak-to-peak battery capacity measurement) is obtained as a function of the peak-to-peak battery voltage measured by amplifier 52 during the application of current pulse I to battery 12, and a second battery capacity measurement (DFT battery capacity measurement) is obtained as a function of the Fourier components of the battery voltage measured by amplifier 52 during the application of current pulse I to battery 12. The current or actual battery capacity is then determined as a function of the first battery capacity measurement and the second battery capacity measurement. In some embodiments of the present invention, if the difference between the first battery capacity measurement and the second battery capacity measurement is within a predetermined threshold, the first battery capacity measurement is output as the actual battery capacity. If the difference between the first battery capacity measurement and the second battery capacity measurement is greater than or equal to the predetermined threshold, the first battery capacity measurement is discarded, and a message is output notifying the tester user of the presence of noise in the battery testing system. Tester 16 can then automatically retest battery 12 after a brief waiting period (for example, 3–4 seconds). Tester 16 carries out the retest by reapplying the current pulse, carrying out a new voltage measurement, recalculating the first and second capacity measurements and comparing these measurements. The tests are repeated until the difference between the first battery capacity measurement and the second battery capacity measurement is below the preset threshold. In some embodiments of the present invention, the output can include a measured noise energy value. An algorithm for determining the peak-to-peak battery voltage measurement, the Fourier components of the measured voltage, and the noise energy can be derived experimentally or through modeling techniques. One such algorithm is described below in connection with FIGS. 2 and 3.

Figure 2:
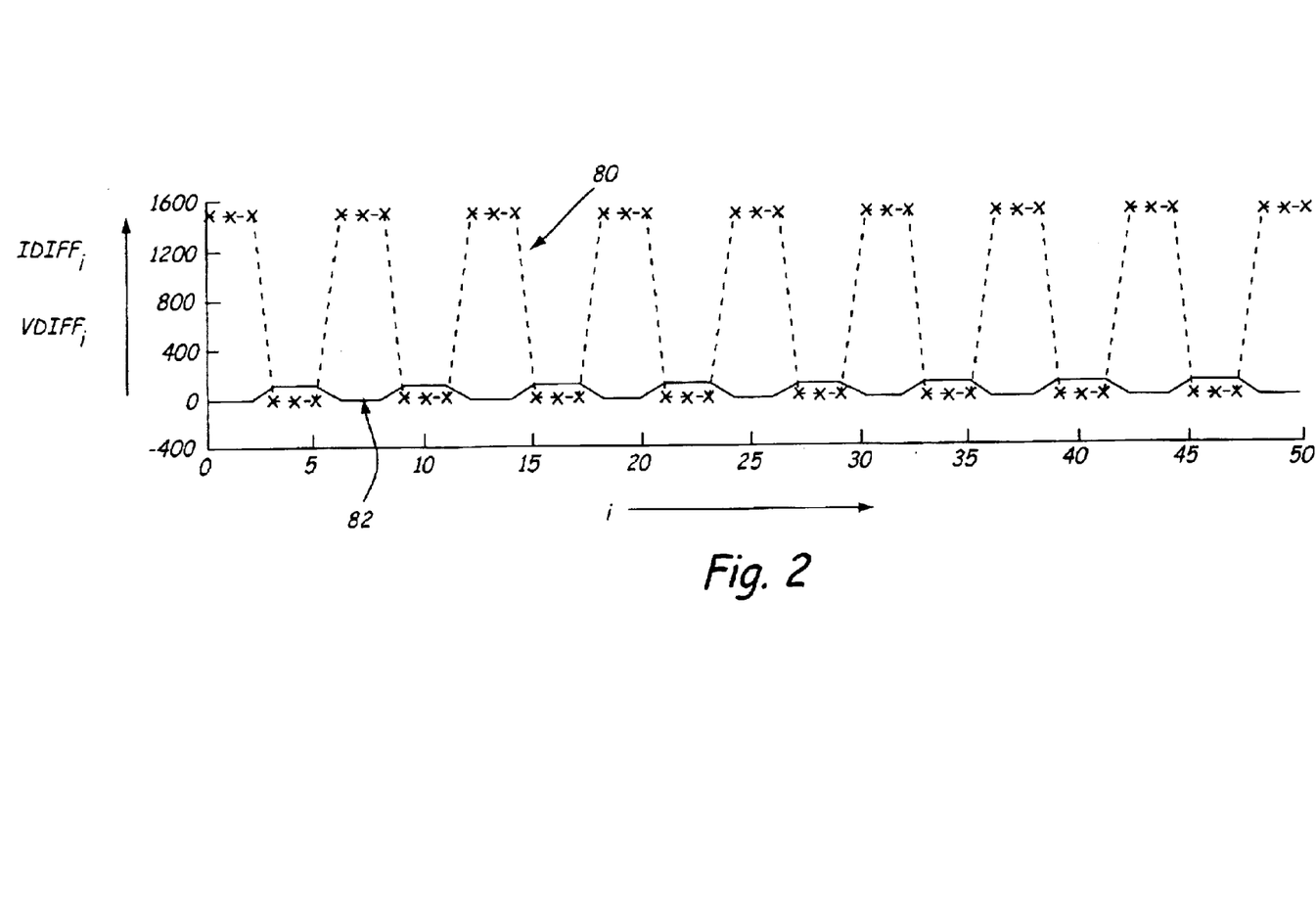
FIG. 2 is a graph of voltage and current waveforms generated using a modeling technique.

FIG. 2 shows current and voltage waveforms from which first and second battery capacity measurements can be obtained. These waveforms are generated as $$IDiff_i = IMag \cdot if(modulus(i,p) > q, IMax, IMin) \qquad \text{Equation 1}$$

and $$VDiff_i = VMag \cdot if(modulus(i,p) > q, VMax, VMin) \qquad \text{Equation 2}$$

where $IDiff_i$ and $VDiff_i$ are the respective values of current and voltage computed for a particular sample index i (i=0 . . . n−1, where n is the number of samples), IMag and VMag are the respective current and voltage magnitudes, IMax and VMax are the respective maximum current and voltage values, IMin and VMin are the respective minimum current and voltage values and p and q are integers that determine the frequency at which maximum and minimum voltage and current values occur.

In FIG. 2, $IDiff_i$ and $VDiff_i$ are plotted along the vertical axis as functions of index i plotted along the horizontal axis to produce voltage waveform 80 and current waveform 82. To generate these example current and voltage waveforms shown in FIG. 2 the following values were used in Equations 1 and 2:

n=384
IMag=100
IMin=0
IMax=1
VMag=1500
VMax=0
VMin=1

The peak-to-peak magnitude of current (IDiffPP) and the peak-to-peak magnitude of voltage (VDiffPP) for current and voltage signals generated utilizing equations 1 and 2 are computed as $$IDiffPP = |IMax - IMin| \qquad \text{Equation 3}$$

and $$VDiffPP = |VMax - VMin| \qquad \text{Equation 4}$$

IDiffPP and VDiffPP values determined using Equations 3 and 4 are employed to determine peak-to-peak battery capacity as described further below in connection with Equation 11.

Figure 3:
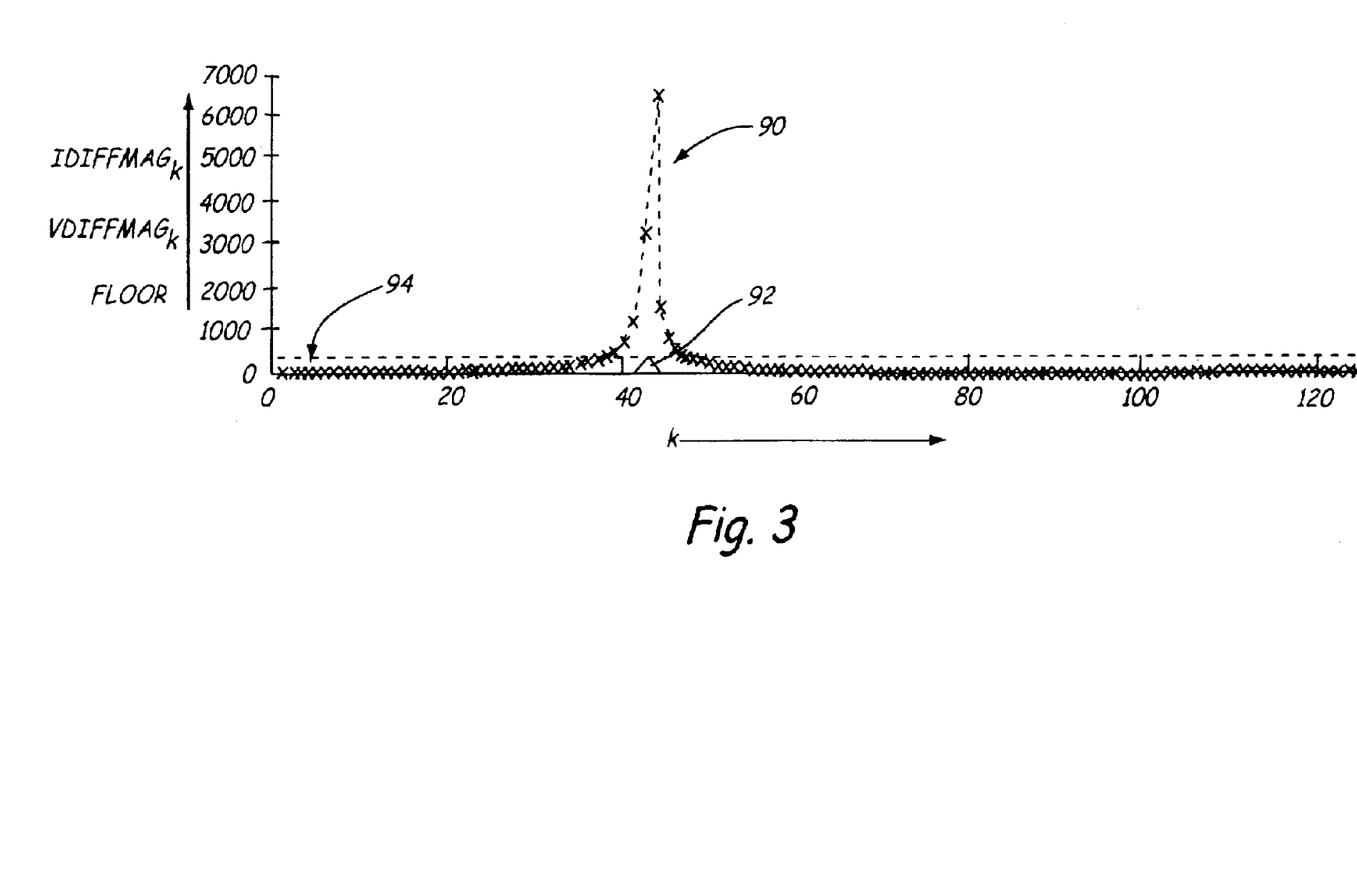
FIG. 3 is a graph of a computed Fourier Transform of the current and voltage values of FIG. 2.

FIG. 3 shows a Discrete Fourier Transform (DFT) current magnitude response and a DFT voltage magnitude response for the respective current and voltage waveforms shown in FIG. 2. In general, the DFT current and voltage magnitude responses are generated as $$DFT(x(m)) = x(k) = \sum_{m=0}^{N-1} (x(m) * e^{-j(2*\pi/N)}) \qquad \text{Equation 5}$$

where x(m) is input series $IDiff_m$ (current) or $VDiff_m$ (voltage) in time and x(k) is the output current or voltage series in frequency calculated for an input sample index m (m=0 . . . N−1, where N is the number of samples) and an output sample index k (k=0 . . . N/2−1). In one embodiment of the present invention, to compute the DFT current magnitude response and the DFT voltage magnitude response, the direct current (DC) or zero Hz frequency component of the current magnitude response (IDiffMag$_0$) and the DC component of the voltage magnitude response (VDiffMag$_0$) are first set to zero.

$$IDiffMag_0=0 \qquad \text{Equation 6}$$

and $$VDiffMag_0=0 \qquad \text{Equation 7}$$

The remaining components of the DFT current magnitude response (IDiffMag$_{k1}$) and the DFT voltage magnitude response (VDiffMag$_k$) are then computed as $$IDiffMag_{k1}=DFT(IDiff_m) \qquad \text{Equation 8}$$

and $$VDiffMag_{k1}=DFT(VDiff_m) \qquad \text{Equation 9}$$

In FIG. 3, IDiffMag$_{k1}$ and VDiffMag$_{k1}$ are plotted along the vertical axis as functions of index k along the horizontal axis to produce current magnitude response plot 90 and voltage magnitude response plot 92. To generate the example current and voltage magnitude response plots shown in FIG. 3 the following values were used in Equations 5:

N=256
m=0 . . . 255
k=0 . . . 127

The battery capacity is separately determined from peak-to-peak current and voltage values and DFT magnitude values as $$CapacityPP = \frac{K \cdot IDiffPP}{VDiffPP} \qquad \text{Equation 11}$$

and $$CapacityDFT = \frac{K \cdot IDiffMag_F}{VDiffMag_F} \qquad \text{Equation 12}$$

where CapacityPP is the peak-to-peak battery capacity expressed in cold cranking amps (CCA), CapacityDFT is the capacity calculated from the DFT magnitude response also expressed in CCA, K is a constant having units of (CCA*Volts)/Amperes, IDiffMag$_F$ is the DFT current magnitude response value at the fundamental frequency (frequency at which the current pulse is applied to the battery) and VDiffMag$_F$ is the DFT voltage magnitude response value at the fundamental frequency.

In the example DFT magnitude response shown in FIG. 3, IDiffMag$_F$ and VDiffMag$_F$ values are at k=43 for a fundamental frequency F=100 Hz.

A determination is made that system noise is present if the absolute value of the error between peak-to-peak capacity and the DFT capacity is greater than a predetermined threshold percentage. This capacity error is computed as $$CapacityError = \left| \frac{CapacityPP - CapacityDFT}{100 \cdot CapacityPP} \right| \qquad \text{Equation 13}$$

Also, if the sum of the noise energy of VDiffMag$_k$ is above a "Floor" level and is more than a predetermined percentage of the fundamental frequency component a determination is made that system noise is present. The noise energy is computed as $$NoiseEnergy = \qquad \text{Equation 14}$$

$$\sum_{k=0}^{\frac{N}{2}-1} \text{if } (|VDiffMag_k| > Floor, |VDiffMag_k|, 0) -$$

$$\frac{|VDiffMag_F| - |VDiffMag_{F-1}| - |VDiffMag_{F+1}|}{100 \cdot |VDiffMag_F|}$$

where VDiffMag$_{F−1}$ is the DFT voltage magnitude response value immediately previous to VDiffMag$_F$, and VDiffMag$_{F+1}$ is the DFT voltage magnitude response value immediately after VDiffMag$_F$.

In the example DFT magnitude response shown in FIG. 3, IDiffMag$_F$ and VDiffMag$_{F+1}$ values are at k=43, VDiffMag$_{F−1}$ is at k=42, VDiffMag$_{F+1}$ is at k=44 and the Floor magnitude is equal to 400. The Floor magnitude is represented by reference numeral 94 in FIG. 3.

Figure 4:
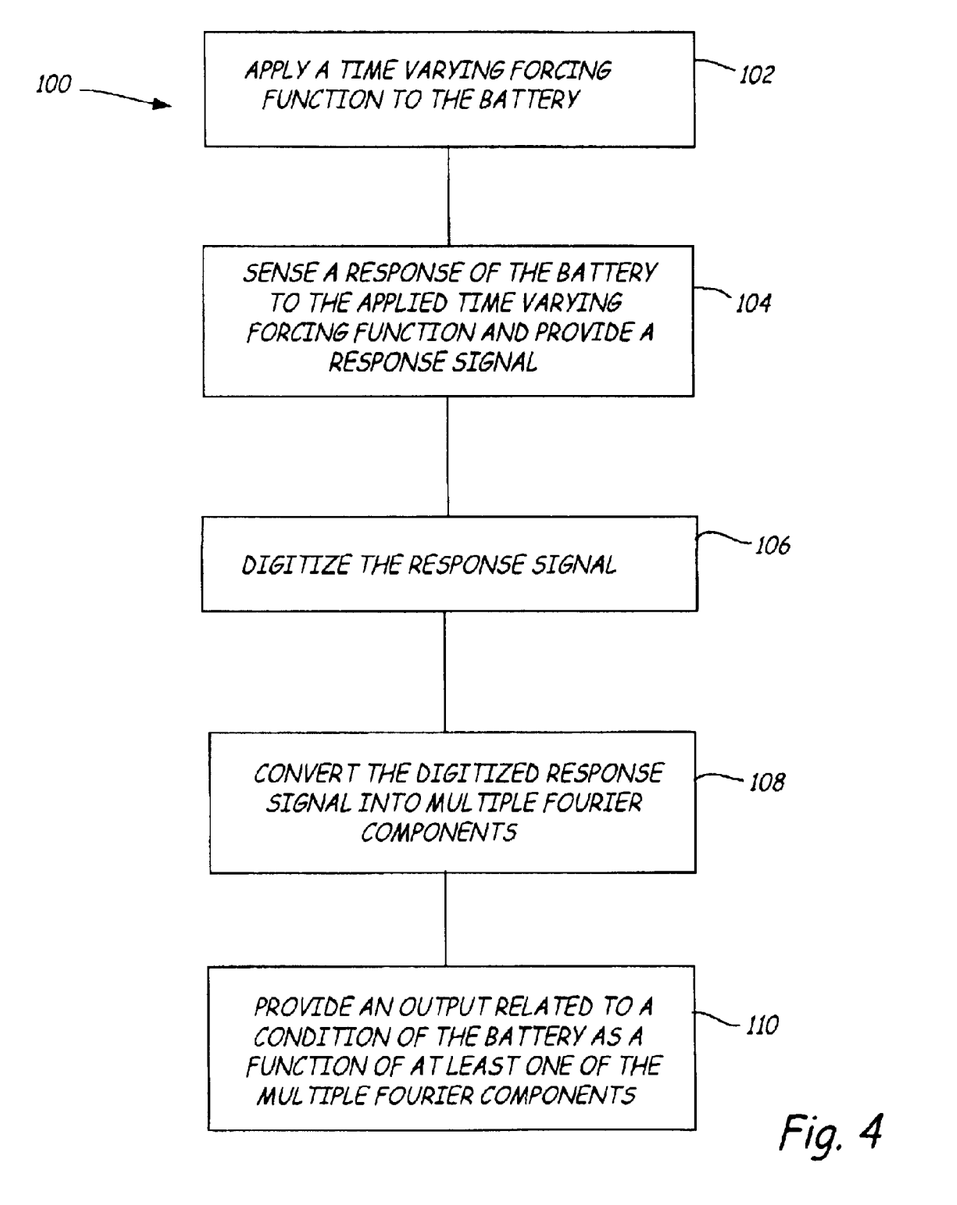
FIG. 4 is a simplified flow chart showing steps in accordance with one embodiment of the present invention.

FIG. 4 is a simplified flow chart 100 showing steps in accordance with one aspect of the present invention. Step 102, a time varying forcing function is applied to the battery through a first pair of connectors of a Kelvin connection. At step 104, the response of the battery to the applied time varying forcing function is sensed through a second pair of connectors of the Kelvin connection to provide a response signal. At step 106, the response signal is digitized. At step 108, the digitized response signal is converted into multiple Fourier components. At step 110, an output related to a condition of the battery is provided as a function at least one of the multiple Fourier components.

The present invention may be implemented using any appropriate technique. For simplicity, a single technique has been illustrated herein. However, other techniques may be used including implementation in all analog circuitry.

Although the present invention has been described with reference to preferred embodiments, workers skilled in the art will recognize that changes may be made in form and detail without departing from the spirit and scope of the invention. A Fast Fourier Transform (FFT) algorithm may be utilized instead of the DFT algorithm to determine the Fourier components described above. The forcing function can be formed by a resistance, by a current sink, through an existing load of the vehicle or any other suitable means. The dynamic parameter determined for the battery may be real or imaginary.

What is claimed is:

1. An electronic battery tester for testing a storage battery, comprising:

a first Kelvin connector configured to electrically couple to a first terminal of the battery;

a second Kelvin connector configured to electrically couple to a second terminal of the battery;

a source configured to apply a time varying forcing function to the battery through a first conductor of the first Kelvin connector and a first conductor of the second Kelvin connector;

a sensor electrically coupled to a second conductor of the first Kelvin connector and a second conductor of the second Kelvin connector configured to sense a response of the storage battery to the applied forcing function and provide a response signal;

an analog to digital converter configured to digitize the response signal; and processing circuitry configured to convert the digitized response signal into a plurality Fourier components, and to determine noise in the response signal from a subset of the plurality of Fourier components, and responsively provide an output related to presence or absence of noise in the response signal.

2. The apparatus of claim 1 wherein the at least one of the plurality of Fourier components is related to a frequency of the forcing function.

3. The apparatus of claim 1 wherein noise is determined using a Discrete Fourier Transform technique.

4. The apparatus of claim 1 wherein the forcing function comprises a load.

5. The apparatus of claim 1 wherein the forcing function comprises a current sink.

6. The apparatus of claim 1 wherein the sensor is configured to sense a voltage having a time varying component.

7. The apparatus of claim 1 wherein the sensor includes a differential amplifier.

8. The apparatus of claim 1 wherein the processing circuitry comprises a digital signal processor.

9. The apparatus of claim 1 wherein the processing circuitry comprises a microprocessor.

10. The apparatus of claim 1 wherein the forcing function comprises a square wave.

11. The apparatus of claim 1 wherein the processing circuitry is further configured to determine a dynamic parameter of the battery.

12. The apparatus of claim 11 wherein the dynamic parameter of the battery comprises conductance.

13. The apparatus of claim 11 wherein the dynamic parameter of the battery is selected from the group consisting of resistance, admittance and impedance.

14. The apparatus of claim 11 wherein the processing circuitry is further configured to determine battery capacity as a function of the dynamic parameter.

15. The apparatus of claim 1 wherein the processing circuitry is further configured to obtain a first battery capacity measurement as a function of peak-to-peak values of the response signal and peak-to-peak values of the forcing function, and to obtain a second battery capacity measurement as a function of the plurality of Fourier components, and to determine battery capacity as a function of the first battery capacity measurement and the second battery capacity measurement.

16. The apparatus of claim 15 wherein the battery capacity is provided at a tester output only if the difference between the first battery capacity measurement and the second battery capacity measurement is below an preset threshold.

17. A method of testing a battery, comprising:

applying a time varying forcing function to the battery through a first pair of connectors of a Kelvin connection;

sensing a response of the battery to the applied time varying forcing function through a second pair of connections of the Kelvin connection and providing a response signal;

digitizing the response signal;

converting the digitized response signal into a plurality of Fourier components;

determining noise in the response signal from a subset of the plurality of Fourier components; and providing an output related to presence or absence of noise in the response signal.

18. The method of claim 17 wherein the at least one of the plurality of Fourier components is related to a frequency of the forcing function.

19. The method of claim 17 wherein noise is determined using a Discrete Fourier Transform technique.

20. The method of claim 17 further comprising obtaining a first battery capacity measurement as a function of peak-to-peak values of the response signal and peak-to-peak values of the forcing function, and obtaining a second battery capacity measurement as a function of the plurality of Fourier components, and determining battery capacity as a function of the first battery capacity measurement and the second battery capacity measurement.

* * * * *